(12) United States Patent
Usui et al.

(10) Patent No.: US 8,247,701 B2
(45) Date of Patent: Aug. 21, 2012

(54) ELECTROCONDUCTIVE PARTICLE PLACEMENT SHEET AND ANISOTROPIC ELECTROCONDUCTIVE FILM

(75) Inventors: Taketoshi Usui, Tokyo (JP); Hitoshi Shimada, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 771 days.

(21) Appl. No.: 12/226,670

(22) PCT Filed: Apr. 26, 2007

(86) PCT No.: PCT/JP2007/059054
§ 371 (c)(1),
(2), (4) Date: Oct. 24, 2008

(87) PCT Pub. No.: WO2007/125993
PCT Pub. Date: Nov. 8, 2007

(65) Prior Publication Data
US 2009/0090545 A1   Apr. 9, 2009

(30) Foreign Application Priority Data
Apr. 27, 2006   (JP) .................................. 2006-123162

(51) Int. Cl.
*H05K 1/16*   (2006.01)
(52) U.S. Cl. ...................................................... 174/260
(58) Field of Classification Search .................... 174/260
See application file for complete search history.

(56) References Cited

U.S. PATENT DOCUMENTS

| | | | | |
|---|---|---|---|---|
| 4,237,088 | A | * | 12/1980 | Yoshimura et al. ......... 264/235.8 |
| 5,942,285 | A | * | 8/1999 | Schmid et al. ................ 427/318 |
| 6,034,331 | A | * | 3/2000 | Tsukagoshi et al. .......... 174/250 |
| 6,042,894 | A | * | 3/2000 | Goto et al. .................... 427/504 |
| 2007/0175579 | A1 | | 8/2007 | Otani et al. |
| 2007/0212521 | A1 | * | 9/2007 | Bessho et al. ................. 428/137 |

FOREIGN PATENT DOCUMENTS

| | | | |
|---|---|---|---|
| EP | 0 691 660 A1 | | 10/1996 |
| JP | 61-195179 | | 8/1986 |
| JP | 01010508 A | * | 1/1989 |
| JP | 3-107888 | | 5/1991 |
| JP | 3-108210 | | 5/1991 |
| JP | 4-366630 | | 12/1992 |
| JP | 7-302668 | | 11/1995 |
| JP | 9-312176 | | 12/1997 |

(Continued)

OTHER PUBLICATIONS

Office Action dated Aug. 4, 2010 in corresponding Chinese application.

*Primary Examiner* — Timothy Thompson
*Assistant Examiner* — Nathan Milakovich
(74) *Attorney, Agent, or Firm* — Finnegan, Henderson, Farabow, Garrett & Dunner, L.L.P.

(57) ABSTRACT

This invention provides an electroconductive particle placement sheet comprising electroconductive particles and an insulating resin sheet. The thickness of the insulating resin sheet is smaller than the average particle diameter of the electroconductive particles. Electroconductive particles are protruded from the reference plane (P1) on at least one side of the insulating resin sheet. The electroconductive particle in is part protruded from the reference plane (P1) is covered with a layer formed of the same resin as in the insulating resin sheet.

18 Claims, 3 Drawing Sheets

FOREIGN PATENT DOCUMENTS

| | | |
|---|---|---|
| JP | 2003-64324 | 3/2003 |
| JP | 2003-92317 | 3/2003 |
| JP | 2005-146044 | 6/2005 |
| JP | 2006-40954 | 2/2006 |
| JP | 2006-73982 | 3/2006 |
| JP | 2006-76576 | 3/2006 |
| WO | WO-2005/054388 A1 | 6/2005 |
| WO | WO 2005096442 A1 * | 10/2005 |

* cited by examiner

ELECTROCONDUCTIVE PARTICLE PLACEMENT SHEET AND ANISOTROPIC ELECTROCONDUCTIVE FILM

TECHNICAL FIELD

The present invention relates to an electroconductive particle placement sheet useful as a connection member to be used for mutual connection between circuit boards or connection between an electronic component such as a semiconductor chip and a circuit board.

BACKGROUND ART

Anisotropic electroconductive films in each of which an electroconductive particle is dispersed in an insulating adhesive are used as a connection member for simply making connection between a liquid crystal display and a semiconductor chip or a TCP (Tape Carrier Package), connection between an FPC (Flexible Printed Circuit) and a TCP, or connection between an FPC and a printed wiring board. For example, anisotropic electroconductive films are widely used for making connection between a liquid crystal display of a laptop computer or a cellular phone and a control IC, and are also used for mounting flip chips in such a way that semiconductor chips are directly mounted on printed boards or flexible wiring boards (Patent Documents 1, 2 and 3).

In the field concerned, in these years, connected wiring patterns and electrode sizes are increasingly miniaturized, and conventional anisotropic electroconductive films in which electroconductive particles are randomly dispersed come to be hardly capable of making such connection as described above with high connection reliability. In other words, when the electroconductive particle density is increased for the purpose of connecting microarea electrodes, the electroconductive particles are agglomerated, and consequently insulation between adjacent electrodes cannot be maintained. Conversely, when the electroconductive particle density is decreased for the purpose of maintaining such insulation, some electrodes are not connected, and consequently it has been accepted that it is difficult to cope with miniaturization while connection reliability is being maintained (Patent Document 4).

On the other hand, an attempt has been made to cope with micropattern connection by using an anisotropic electroconductive film in which by making the thickness of an insulating film smaller than the electroconductive particle diameter, the electroconductive particles are exposed to the front and back sides of the film (Patent Document 5). However, when the thickness of the insulating film is smaller than the particle diameter, air pools are formed in the connection area and consequently adhesion failure tends to be caused. For the purpose of preventing such failure, on one side of the insulating film, an insulating adhesive layer is further formed. In such as case, for the purpose of developing the connection reliability in the connection of microarea connection, the thickness of the insulating film is preferably as small as possible. However, when the thickness of the insulating film is small, the electroconductive particles tend to be detached during production process or during use, hence connection defects are caused, and consequently, the reduction of the thickness of the insulating film is limited.

Patent Document 1: JP-A-03-107888
Patent Document 2: JP-A-04-366630
Patent Document 3: JP-A-61-195179
Patent Document 4: JP-A-09-312176
Patent Document 5: JP-A-07-302666

DISCLOSURE OF THE INVENTION

An object of the present invention is to provide an electroconductive particle placement sheet which is excellent in connection reliability of microelectrodes, high in insulation between adjacent electrodes with narrow spaces therebetween, and capable of making low-resistance connection, in the electrical connection in micropattern wiring, and low in the occurrence probability of detachment of electroconductive particles in the course from the production to the use thereof.

The present inventors made a continuous, diligent study for the purpose of solving the above-described problems, and consequently perfected the present invention by discovering that adaptable to the above-described object is a specific shape of electroconductive particle placement sheet including an insulating resin sheet smaller in sheet thickness than the average particle diameter of the electroconductive particles and the electroconductive particles located in the sheet.

The above-disclosed techniques developed prior to the filing of the present application for the purpose of solving the above-described problems each probably find a difficulty in ensuring connection reliability; specifically, for example, the technique disclosed in Patent Document 5 probably finds a difficulty in ensuring connection reliability because of any of the adhesion failure due to the air pools in the connection area, the connection failure due to the fluidity of the electroconductive particle at the time of connection, the conduction inhibition due to the film-forming resin remaining in the connection portion, and the conduction failure due to the detachment of the electroconductive particle.

According to the present invention, the above-described problems have been able to be solved in such a way that an insulating resin sheet covers the surface of the electroconductive particle located in the insulating resin sheet and having an average particle diameter larger than the thickness of the insulating resin sheet, and this fact is a finding that cannot be easily anticipated by those skilled in the art, in view of the techniques disclosed in above-described Patent Documents.

Specifically, the present invention is as follows.

(1) An electroconductive particle placement sheet comprising electroconductive particles and an insulating resin sheet having a reference plane P1 and a reference plane P2 opposite thereto, wherein a thickness of the insulating resin sheet is smaller than an average particle diameter of the electroconductive particles, the electroconductive particle protrudes from at least the reference plane P1 on one side of the insulating resin sheet, and a portion of the electroconductive particle, protruding from the reference plane P1 of the insulating resin sheet is covered with a coating layer formed of the same resin as the insulating resin that forms the insulating resin sheet; and a relation $h_1 > h_2$ is satisfied wherein an average of a distance between the reference plane P1 and a tangential line L1 of the electroconductive particle which is parallel to the reference plane P1 and tangential to the portion of the electroconductive particle, protruding from the reference plane P1 is defined as an average protrusion height $h_1$ ($h_1 > 0$), and an average of a distance between the reference plane P2 and a tangential line L2 of the electroconductive particle which is parallel to the reference plane P2 and is located on the opposite side of the electroconductive particle from the tangential line L1 is defined as an average protrusion height $h_2$ (provided that $h_2 < 0$ if the tangential line L2 is located within the insulating resin sheet, $h_2 = 0$ if the tangential line L2 is located on the reference plane P2, and $h_2 > 0$ if the tangential line L2 is located outside the insulating resin sheet).

(2) The electroconductive particle placement sheet according to (1), wherein the electroconductive particle protrudes from both sides of the insulating resin sheet, and a ratio, h2/h1, of the average protrusion height h2 to the average protrusion height h1 is 0 or more and 1/1.1 or less.

(3) The electroconductive particle placement sheet according to (2), wherein the electroconductive particle protruding from the reference plane P2 is exposed from the insulating resin sheet.

(4) The electroconductive particle placement sheet according to (1), wherein a coating thickness of a top portion of the coating layer of the electroconductive particle protruding from the reference plane P1 is 0.1 μm or more and 2 μm or less.

(5) The electroconductive particle placement sheet according to (1), wherein an area proportion of the electroconductive particle defined as a proportion of a sum of projected areas of the electroconductive particles in relation to an area of the insulating resin sheet is 2% or more and 40% or less.

(6) The electroconductive particle placement sheet according to (1), wherein the insulating resin sheet comprises a phenoxy resin.

(7) The electroconductive particle placement sheet according to (1), wherein the average particle diameter of the electroconductive particles is 0.5 μm or more and 10 μm or less.

(8) The electroconductive particle placement sheet according to (1), wherein a variation coefficient of an intercentral distance between the electroconductive particles is 0.03 or more and 0.6 or less.

(9) The electroconductive particle placement sheet according to (1), wherein a melt viscosity of the insulating resin sheet at 180° C. is 10 Pa·s or more and $5 \times 10^4$ Pa·s or less.

(10) A method for producing an electroconductive particle placement sheet, comprising:

forming an electroconductive particle layer by filling a stretchable sheet with electroconductive particles in a manner providing a single layer;

forming an insulating resin layer on the electroconductive particle layer so as to form an electroconductive particle-filled sheet; and stretching the electroconductive particle-filled sheet.

(11) The method according to (10), wherein when the electroconductive particle layer is formed by filling the stretchable sheet with the electroconductive particles in a manner providing a single layer, an sticking agent is applied to the stretchable sheet, and then the electroconductive particle layer is formed by filling the sticking agent with the electroconductive particles in a manner providing a single layer.

(12) The method according to (10), wherein a thickness of the insulating resin layer in the electroconductive particle-filled sheet is 1.0 or more times and 10 or less times the average particle diameter of the electroconductive particles.

(13) The method according to (11), wherein when the sticking agent is applied to the stretchable sheet followed by forming the electroconductive particle layer by filling the sticking agent with the electroconductive particles in a manner providing a single layer, the electroconductive particles are embedded in the sticking agent.

(14) The method according to (10), wherein when the electroconductive particle layer is formed by filling the stretchable sheet with the electroconductive particles in a manner providing a single layer, the stretchable sheet is filled with the electroconductive particles in such a way that a filling factor defined as a ratio of the projected areas of the electroconductive particles to a total area is 50% or more and 90% or less.

(15) The method according to (10), wherein when the insulating resin layer is formed on the electroconductive particle layer, a sheet-shaped insulating resin is formed as the insulating resin layer on the electroconductive particle layer.

(16) The method according to (10), wherein when the insulating resin layer is formed on the electroconductive particle layer, an insulating resin obtained by applying the insulating resin dissolved in a solvent and by drying the solvent is formed as the insulating resin layer on the electroconductive particle layer.

(17) The method according to (10), wherein an area magnification factor defined as a product of a longitudinal stretching magnification factor and a transverse stretching magnification factor is 2.2 or more and 25 or less.

(18) An anisotropic electroconductive film, comprising the electroconductive particle placement sheet according to any one of (1) to (9) and an insulating adhesive layer laid on at least one side of the sheet.

(19) The anisotropic electroconductive film, comprising the electroconductive particle placement sheet produced by the method according to any one of (10) to (17) and the insulating adhesive layer laid on at least one side of the sheet.

(20) A circuit connection method electrically connecting electrodes of an IC chip to electrodes of a circuit board, comprising applying pressure under the conditions that the anisotropic electroconductive film according to (18) or (19) is held between the circuit board and the IC chip.

(21) A connected structure obtained by the method according to (20).

The electroconductive particle placement sheet of the present invention is excellent in connection reliability of microelectrodes, high in insulation between adjacent electrodes with narrow spaces therebetween, and capable of making low-resistance connection, in the electrical connection in micropattern wiring, and is low in the occurrence probability of detachment of electroconductive particles in the course from the production to the use thereof and has advantageous effects to enable micropattern connection.

BEST MODE FOR CARRYING OUT THE INVENTION

Hereinafter, the present invention is described specifically.

An electroconductive particle placement sheet of the present invention includes electroconductive particles and an insulating resin sheet.

Examples of such a usable electroconductive particle include a metal particle or a particle prepared by coating a polymer core with a metal thin film.

As a metal particle, a particle having a uniform composition, made of a metal or an alloy is used. Examples of such a metal particle include particles each formed of gold, silver, copper, nickel, aluminum, zinc, tin, lead, solder, indium and palladium, and particles of two or more of these metals combined in a layered manner or in a graded manner.

Examples of the particle prepared by coating a polymer core with a metal thin film include particles each of which is prepared by coating a polymer core formed of at least one polymer selected from the group consisting of epoxy resin, styrene resin, silicone resin, acrylic resin, polyolefin resin, melamine resin, benzoguanamine resin, urethane resin, phenolic resin, polyester resin, divinylbenzene-crosslinked resins, nitrile rubber (NBR) and styrene-butadiene rubber (SBR), with a metal thin film formed of a metal selected from the group consisting of gold, silver, copper, nickel, aluminum, zinc, tin, lead, solder, indium and palladium, or formed of a combination of two or more of these metals.

The thickness of the metal thin film preferably falls within a range of 0.005 μm or more and 1 μm or less from the viewpoint of connection stability and particle agglomeration. From the viewpoint of connection stability, it is preferable to uniformly coat the polymer core with the metal thin film. Examples of the method for coating the polymer core with the metal thin film include a plating method.

In particular, a particle prepared by coating a polymer core with a metal thin film is preferable, a particle prepared by coating a polymer core with gold is more preferable, and a particle prepared by coating a polymer core with nickel and thereafter further coating with gold is furthermore preferable.

For the polymer core, benzoguanamine resin, divinylbenzene-crosslinked resins and acrylic resin are preferable.

The average particle diameter of the electroconductive particles preferably falls within a range of 0.5 μm or more and 10 μm or less, from the viewpoint of the agglomeration of the electroconductive particles and the anisotropic electroconductivity. The average particle diameter of the electroconductive particles is more preferably 1.0 μm or more and 7.0 μm or less, furthermore preferably 1.5 μm or more and 6.0 μm or less, still furthermore preferably 2.0 μm or more and 5.5 μm or less, and yet furthermore preferably 2.5 μm or more and 5.0 μm or less. The smaller the standard deviation of the particle diameter of the electroconductive particles, the more preferable. The standard deviation of the particle diameter of the electroconductive particles is preferably 50% or less, more preferably 20% or less, furthermore preferably 10% or less and still furthermore preferably 5% or less of the average particle diameter.

Examples of the method for measuring the average particle diameter of the electroconductive particles include a method in which a Coulter counter is used. Additionally, examples of the usable methods include a method in which the average particle diameter is derived from the specific surface area measurement based on the BET method, and a method in which the particle diameter is measured by using light scattering.

The insulating resin layer includes one or more insulating resins selected from the group consisting of a curable resin and a thermoplastic resin.

A curable resin is a resin that causes curing reaction by the energy of heat, light or electron beam; examples of such a resin include epoxy resin, phenolic resin, silicone resin, isocyanate curing resin, vinyl resin and acryl group-containing resins.

Examples of the thermoplastic resin include urethane resin, acrylic resin, polyimide resin, phenoxy resin, polyvinyl butyral resin, SBR, SBS, NBR, polyethersulfone resin, polyetherterephthalate resin, polyphenylene sulfide resin, polyamide resin, polyetheroxide resin, polyacetal resin, polystyrene resin, polyethylene resin, polyisobutylene resin, alkylphenolic resin, styrene-butadiene resin, carboxyl-modified nitrile resin, polyphenylene ether resin, polycarbonate resin, polyether ketone resin and the modified resins of these resins.

In particular, when long-term reliability after connection is required, the insulating resin sheet preferably includes therein at least one of epoxy resin and phenoxy resin; inclusion of phenoxy resin is particularly preferable.

Examples of the epoxy resin include: glycidyl ether epoxy resins such as bisphenol A epoxy resin, bisphenol F epoxy resin, bisphenol S epoxy resin, tetramethylbisphenol A epoxy resin, biphenol epoxy resin, naphthalene epoxy resin, fluorene epoxy resin, phenol novolac epoxy resin, cresol novolac epoxy resin, bisphenol A novolac epoxy resin and aliphatic ether epoxy resin; glycidyl ether ester epoxy resin; glycidyl ester epoxy resin; glycidyl amine epoxy resin; hydantoin epoxy resin; and alicyclic epoxide. These epoxy resins may have undergone halogenation or hydrogenation. Additionally, examples of the epoxy resin may also include modified epoxy resins prepared by modification such as urethane modification, rubber modification or silicone modification. In particular, glycidyl ether epoxy resin is preferable.

The insulating resin sheet may include a curing agent for epoxy resin. The curing agent for epoxy resin is preferably a latent curing agent from the viewpoint of storage stability. Preferable examples of such a latent curing agent include boron compounds, hydrazide, tertiary amines, imidazole, dicyandiamide, inorganic acids, carboxylic acid anhydrides, thiol, isocyanate and boron complexes, and derivatives thereof. Preferable among the latent curing agents are microcapsule curing agents.

A microcapsule curing agent is prepared by stabilizing the surface of any of the above-described curing agents with resin coating or the like. A microcapsule curing agent undergoes breaking of the resin coating thereof due to the temperature or pressure applied at the time of connection operation, to make the curing agent diffuse outside the microcapsule and the curing agent is allowed to react with epoxy resin. Among the microcapsule latent curing agents, latent curing agents prepared by microcapsulation of adduct curing agents such as amine adducts and imidazole adducts are excellent in the balance between stability and curability, and accordingly preferable. A curing agent for epoxy resin is used generally in an amount of 0 to 100 parts by mass in relation to 100 parts by mass of epoxy resin.

The insulating resin sheet is required to have a low fluidity as a property thereof under the connection conditions for the purpose of suppressing the reduction of the number of the electroconductive particles to be captured between the electrodes to be connected to each other, at the time of connection, on the sheet, toward outside the sheet, inside the sheet or together with the sheet. Further, the insulating resin sheet preferably contains phenoxy resin for the additional purpose of maintaining the long-term connection reliability.

Examples of the phenoxy resin include bisphenol A phenoxy resin, bisphenol F phenoxy resin, bisphenol A-bisphenol F mixed phenoxy resin, bisphenol A-bisphenol S mixed phenoxy resin, fluorene ring-containing phenoxy resin and caprolactone-modified bisphenol A phenoxy resin. The weight average molecular weight of the phenoxy resin is preferably $2 \times 10^4$ or more and $10 \times 10^4$ or less. The weight average molecular weight can be measured by gel permeation chromatography (GPC) with polystyrene standards.

For the insulating resin sheet used in the present invention, it is preferable to use a phenoxy resin and an epoxy resin in combination, and in this case, the phenoxy resin is used in a content of preferably 60% by mass or more, more preferably 70% by mass or more and 99.5% by mass or less, furthermore preferably 75% by mass or more and 99% by mass or less, and still furthermore preferably 80% by mass or more and 98% by mass or less, in relation to the insulating resins forming the insulating resin sheet.

The insulating resin sheet may also further contain, for example, an insulating particle, a filler, a flexibilizer, an accelerator, an antiaging agent, a colorant, a flame retarder, a thixotropic agent and a coupling agent. When an additive such as an insulating particle or a filler is contained, the maximum diameter of the additive is preferably smaller than the average particle diameter of the electroconductive particles. As the coupling agent, from the viewpoint of improving adhesiveness, preferable are silane coupling agents each containing a ketimine group, a vinyl group, an acryl group, an amino group, an epoxy group or an isocyanate group. When a coupling agent is contained in the insulating resin sheet, the content of the coupling agent is 0.05% by mass or more and 2% by mass or less in relation to the insulating resin(s).

When the individual components of the insulating resin sheet are mixed together, a solvent may be used according to need. Examples of the solvent include methyl ethyl ketone, methyl isobutyl ketone, diethyl ketone, cyclohexanone, cyclopentanone, toluene, xylene, ethyl acetate, butyl acetate, ethylene glycol monoalkyl ether acetate, propylene glycol monoalkyl ether acetate, ethanol, isopropanol, dimethyl formamide and dimethyl acetamide.

The insulating resin sheet can be prepared, for example, as follows: the individual components of the insulating resin sheet are mixed in a solvent to prepare a coating liquid, the coating liquid is applied to a substrate by applicator coating, and the solvent is evaporated in an oven to prepare the insulating resin sheet. The viscosity of the coating liquid at 25° C. is preferably 50 mPa·s or more and 10000 mPa·s or less, more preferably 200 mPa·s or more and 8000 mPa·s or less and furthermore preferably 500 mPa·s or more and 5000 mPa·s or less. When the individual components are mixed together in a solvent, the solvent may be heated for the purpose of improving the solubility. The mixing temperature is preferably room temperature or higher and 100° C. or lower and more preferably 50° C. or higher and 80° C. or lower. The solvent evaporation in an oven is preferably conducted at 50° C. or higher and 100° C. or lower and more preferably 60° C. or higher and 90° C. or lower. The time for evaporation is preferably 2 minutes or more and 20 minutes or less and more preferably 5 minutes or more and 15 minutes or less.

The insulating resin sheet is preferably low in fluidity under the connection conditions for the purpose of suppressing the flow of the electroconductive particles, at the time of connection, on the sheet, toward outside the sheet, inside the sheet or together with the sheet. On the other hand, for the purpose of bringing the electroconductive particle into direct contact with an electrode, the insulating resin sheet is required to be removed from above the electroconductive particle by hot pressing at the time of connection; in other words, the insulating resin sheet is required to flow; thus for the purpose of satisfying these two conflicting performances, it is preferable for the insulating resin sheet to have an appropriate range of melt viscosity at the connection temperature. Additionally, the melt viscosity of the insulating resin sheet at 180° C. is preferably 10 Pa·s or more and $5 \times 10^4$ Pa·s or less, more preferably 20 Pa·s or more and $3 \times 10^4$ Pa·s or less, furthermore preferably 50 Pa·s or more and $2 \times 10^4$ Pa·s or less, still furthermore preferably 80 Pa·s or more and $1 \times 10^4$ Pa·s or less, yet furthermore preferably 100 Pa·s or more and $5 \times 10^3$ Pa·s or less, and still yet furthermore preferably 200 Pa·s or more and $2 \times 10^3$ Pa·s or less.

Herein, it is to be noted that when the insulating resin sheet includes a thermosetting resin, the melt viscosity of the insulating resin sheet means the melt viscosity under the condition that the curing agent has been removed from the insulating resin sheet, or no curing agent has been mixed in the insulating resin sheet.

In the present invention, the insulating resin sheet is required to have a thickness smaller than the average particle diameter of the electroconductive particles for the purpose of effectively applying pressure to the electroconductive particle at the time of connection to realize a low connection resistance. The thickness of the insulating resin sheet is preferably 0.05 or more times and 0.8 or less times, more preferably 0.07 or more times and 0.7 or less times, furthermore preferably 0.1 or more times and 0.6 or less times, still furthermore preferably 0.12 or more times and 0.5 or less times and yet furthermore preferably 0.15 or more times and 0.4 or less times the average particle diameter of the electroconductive particles.

The thickness of the insulating resin sheet is preferably 0.1 μm or more and 5 μm or less, more preferably 0.2 μm or more and 3 μm or less, furthermore preferably 0.3 μm or more and 2 μm or less and still furthermore preferably 0.4 μm or more and 1.5 μm or less.

The thickness of the insulating resin sheet means the thickness of the particle-free portion of the insulating resin sheet, and is derived as an arithmetic mean of the sheet thickness values at the points each of which is separated from a plane (hereinafter, referred to as the particle-contacting plane) in contact with any one of the electroconductive particles and perpendicular to the sheet surface, by a distance of ½ the particle diameter of the contacting particle (provided that no electroconductive particle is found at the concerned point). Additionally, the thickness of the insulating resin sheet is defined as the arithmetic mean of the sheet thickness values at the midpoints between the adjacent electroconductive particles when the electroconductive particle density is high, and accordingly, the distance between the particle-contacting plane of any one electroconductive particle and the particle-contacting plane of the adjacent electroconductive particle is less than ½ the particle diameter, and hence the adjacent particle is found within a separation of ½ the particle diameter from the particle-contacting plane of the any one electroconductive particle. The thickness of the insulating resin sheet can be measured from, for example, a scanning electron microscope image of a cross section of the sheet.

Figure 1:
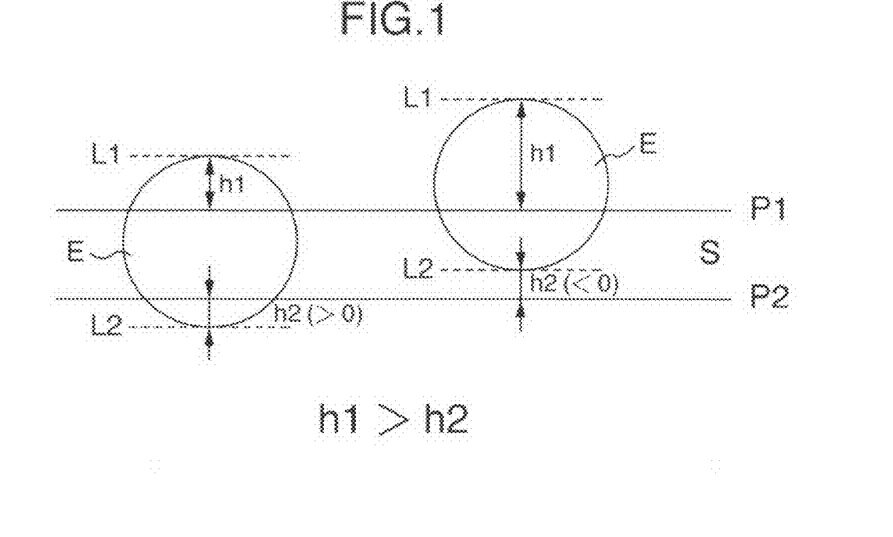
FIG. 1 is a schematic view illustrating the relations between reference planes P1 and P2 and average protrusion heights h1 and h2.

Hereinafter, with reference to FIG. 1, the relations between the reference planes P1 and P2 and the average protrusion heights h1 and h2 in the present invention.

The insulating resin sheet S has two opposite surfaces, namely, the front and back surfaces, which are referred to as the reference plane P1 and the reference plane P2, respectively. Here, it should be understood that in the electroconductive particle placement sheet of the present invention, the electroconductive particle E protrudes from the reference plane P1 of the insulating resin sheet S, and a relation h1>h2 is satisfied wherein an average of a distance between the reference plane P1 and a tangential line L1 of the electroconductive particle E which is parallel to the reference plane P1 and tangential to the portion of the electroconductive particle E, protruding from the reference plane P1 is defined as an average protrusion height h1 (h1>0), and an average of a distance between the reference plane P2 and a tangential line L2 of the electroconductive particle E which is parallel to the reference plane P2 and is located on the opposite side of the electroconductive particle E from the tangential line L1 is defined as an average protrusion height h2. Here, it is defined that h2<0 if the tangential line L2 is located within the insulating resin sheet (the right hand side of FIG. 1), h2=0 if the tangential line L2 is located on the reference plane P2, and h2>0 if the tangential line L2 is located outside the insulating resin sheet (the left hand side of FIG. 1).

Figure 2:
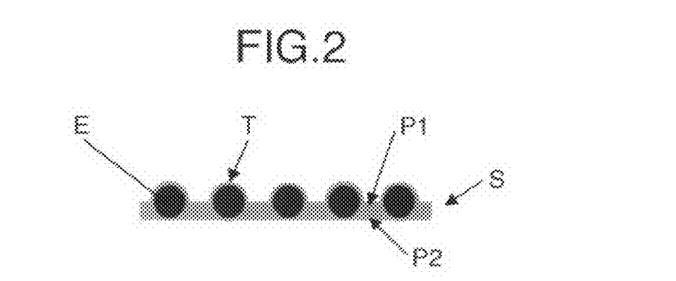
FIG. 2 is a schematic cross sectional view illustrating an electroconductive particle placement sheet of the present invention.

In the present invention, the electroconductive particle E is located in the insulating resin sheet S, the average particle diameter of the electroconductive particle E is larger than the thickness of the insulating resin sheet S, and hence the electroconductive particle E protrudes at least from the reference plane P1 on one side of the insulating resin sheet S (FIG. 2). Additionally, the portion of the electroconductive particle E, protruding from the reference plane P1 of the insulating resin sheet S is covered with a coating layer T formed of the same resin as the insulating resin that forms the insulating resin sheet S (FIG. 2). The electroconductive particle E may protrude from the both sides of the insulating resin sheet S.

In this case, in a comparison between the absolute value |h1| of the average protrusion height h1 of the electroconductive particle from the reference plane P1 and the absolute value |h2| of the average protrusion height h2 of the electroconductive particle from the reference plane P2, the relation $$0 \leq |h2|/|h1| \leq 1/1.1$$

is preferably satisfied, and
the relation $$0 \leq |h2|/|h1| \leq 1/3$$

is more preferably satisfied. For example, in a case where the electroconductive particle protrudes from the both sides of the insulating resin sheet (h1>0 and h2>0), these relations respectively show that the protrusion height h1 is preferably 1.1 or more times the protrusion height h2, and more preferably 3 or more times the protrusion height h2.

The protrusion height h2 is preferably small for the purpose of maintaining high adhesiveness to the member to be connected when the electroconductive particle placement sheet of the present invention is used, or for the purpose of preventing the entraining of air when the electroconductive particle placement sheet of the present invention is bonded to another sheet; the protrusion height h2 is more preferably 0.3 μm or less, furthermore preferably 0.2 μm or less and still furthermore preferably 0.1 μm or less.

The protrusion height h2 may be 0 μm or less; in other words, no protrusion of the electroconductive particle may be acceptable. The electroconductive particle may also be completely embedded in the insulating resin sheet as seen from the reference plane P2.

The protrusion height h2 is preferably 0 μm or more and 0.1 μm or less. The protrusion height h2 is −0.5 or more times, preferably 4 or less times, more preferably 3 or less times, furthermore preferably 2 or less times, yet furthermore preferably 0.5 or less times and still furthermore preferably 0.1 or less times the thickness of the insulating resin sheet. The electroconductive particle protruding from the reference plane P2 of the insulating resin sheet readily attains a low connection resistance when exposed from the insulating resin sheet.

When the electroconductive particle protrudes from the reference plane P2, the protrusion height h2 is the height to the top, on the side with the smaller protrusion height, of the electroconductive particle from the plane on the side with the smaller protrusion height, namely, the reference plane P2 of the approximately uniform planes of the electroconductive particle-free portion of the insulating resin sheet; the protrusion height h2 can be measured with an instrument such as a laser microscope.

On the side with the larger protrusion height of the electroconductive particle, namely, the reference plane P1, for the purpose of attaining a low connection resistance due to the pressure effectively applied to the electroconductive particle at the time of connection, the protrusion height h1 of the electroconductive particle is preferably 0.2 or more times, more preferably 0.25 or more times and 0.95 or less times, furthermore preferably 0.3 or more times and 0.9 or less times, still furthermore preferably 0.35 or more times and 0.85 or less times, and yet furthermore preferably 0.4 or more times and 0.8 or less times the average particle diameter of the electroconductive particle.

Here, the protrusion height h1 can also be represented as the height to the top of the electroconductive particle from the approximately uniform plane of the electroconductive particle-free portion of the insulating resin sheet. For example, the protrusion height h1 can be measured directly from a scanning electron microscope image of a cross section of the sheet. The protrusion height h1 may also be obtained as a value of the average particle diameter of the electroconductive particles minus the protrusion height h2 and the thickness of the insulating resin sheet.

In the present invention, the side (reference plane 1) with the larger protrusion height can suppress the detachment of the electroconductive particle during production and during use thereof and can maintain a high insulation in the connection between microelectrodes, under the condition that the electroconductive particle is covered with a coating layer formed of the same resin as the insulating resin that forms the insulating resin sheet. The thickness of the coating layer, in the protruding portion on the side with the larger protrusion height, formed of the same resin as the insulating resin that forms the insulating resin sheet may be approximately uniform, may decrease in a graded manner from the side of the insulating resin sheet toward the top of the particle, or as an intermediate case, may decrease toward the top in a graded manner in the vicinity of the reference plane P1 of the insulating resin sheet and may be approximately uniform from a midway location. From the viewpoint of preventing the detachment of the electroconductive particle, the thickness of the coating layer preferably decreases in a graded manner at least partially as in the above-described latter two cases.

The coating thickness of the coating layer (hereinafter referred to as the coating thickness) of the top of the electroconductive particle protruding from the reference plane P1 of the insulating resin sheet is preferably 0.1 μm or more and 2 μm or less, more preferably 0.15 μm or more and 1.8 μm or less, more preferably 0.2 μm or more and 1.6 μm or less, furthermore preferably 0.25 μm or more and 1.4 μm or less and still furthermore preferably 0.3 μm or more and 1.2 μm or less. The coating thickness is preferably 0.1 or more times and 1.0 or less times, more preferably 0.1 or more times and 0.96 or less times, furthermore preferably 0.12 or more times and 0.7 or less times, still furthermore preferably 0.15 or more times and 0.6 or less times and yet furthermore preferably 0.2 or more times and 0.5 or less times the thickness of the insulating resin sheet. The coating thickness falling within an appropriate range preferably can make difficult the detachment of the electroconductive particle and can suppress the conduction resistance to be low at the time of connection.

The electroconductive particle placement sheet of the present invention is a sheet in which the electroconductive particle is dispersed and placed in an insulating resin sheet. The thickness of the insulating resin sheet is smaller than the average diameter of the electroconductive particles, and consequently, the electroconductive particles are placed in the same plane. The electroconductive particles are preferably placed individually and independently in such a way that two or more particles does not agglomerate. When two or more particles agglomerate, the proportion of the agglomerated particles is preferably 30% or less and more preferably 20% or less in terms of the number of particles. The area proportion of the electroconductive particle defined as the proportion of the sum of the projected areas of the electroconductive particles in relation to the area of the insulating resin sheet preferably falls within a range of 2% or more and 40% or less, because such a range ensures a satisfactory balance between conductivity and insulation; the area proportion of the electroconductive particle is more preferably 4% or more and 35% or less, furthermore preferably 6% or more and 30% or less, still furthermore preferably 8% or more and 27% or less and yet furthermore preferably 10% or more and 25% or less.

In order to reduce the variation of the connection resistance over the individual electrodes, the electroconductive particles are preferably placed in a highly regular array. When the variation coefficient (the standard variation divided by the average) of the intercentral distance between the electroconductive particles is adopted as a measure of the array performance, the value thereof is preferably 0.6 or less, more preferably 0.03 or more and 0.5 or less, furthermore preferably 0.05 or more and 0.45 or less, still furthermore preferably 0.07 or more and 0.42 or less, yet furthermore preferably 0.09 or more and 0.4 or less and still yet furthermore preferably 0.1 or more and 0.35 or less.

The electroconductive particle placement sheet of the present invention may be present as an independent article, but may also be formed on a releasable substrate. Examples of the releasable substrate used include: films of polyethylene, polypropylene, polystyrene, polyester, nylon, polyvinyl chloride and polyvinyl alcohol; and these films subjected to treatments such as silicone treatment and fluorine treatment to improve the releasability thereof.

Examples of the type of the electroconductive particle placement sheet of the present invention include a sheet type and a long sheet type.

Examples of the method for producing the electroconductive particle placement sheet of the present invention include the following method.

Figure 3:
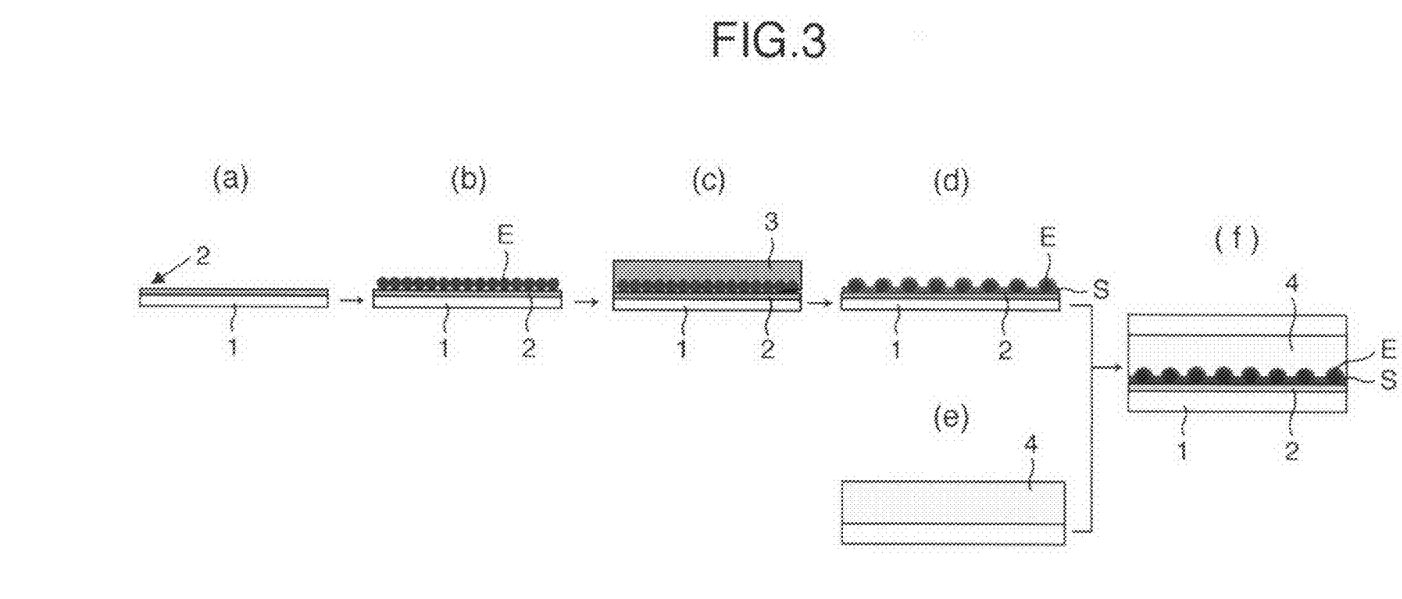
FIG. 3 is a schematic view illustrating the production of an anisotropic electroconductive film of the present invention.

Specifically, as shown in FIG. 3, first an sticking agent 2 is applied to a stretchable sheet 1 so as for the thickness of the sticking agent layer to be equal to or smaller than the average diameter of the electroconductive particles (FIG. 3($a$)), and then the electroconductive particle E is placed on the sticking agent layer in a more-than-necessary amount so as to fill the sticking agent layer with the electroconductive particles.

Preferable examples of the sticking agent include urethane resin, acrylic resin, urea resin, melamine resin, phenolic resin, vinyl acetate resin, chloroprene rubber, nitrile rubber, styrene-butadiene rubber, isoprene rubber and natural rubber.

After filling with the electroconductive particles, by removing with, for example, air blow the electroconductive particles having not reached the sticking agent layer, an electroconductive particle layer is formed by densely filing the sticking agent layer with electroconductive particles in a manner providing a single layer (FIG. 3($b$)). According to need, the electroconductive particles placed in a manner providing a single layer are embedded in the sticking agent. In this case, a filling factor defined as a ratio of the projected area of the electroconductive particles to the total area is preferably 50% or more and 90% or less, more preferably 55% or more and 88% or less and furthermore preferably 60% or more and 85% or less. The filling factor significantly affects the array performance.

Next, on the electroconductive particle layer densely filled in a manner providing a single layer, an insulating resin layer 3 is formed (FIG. 3($c$)) to yield an electroconductive particle-filled sheet. In this case, the insulating resin layer may be formed on the particle layer by applying a layer that has already been shaped as a sheet, or may be formed by applying an insulating resin dissolved in a solvent to the particle layer and by drying the solvent.

The thickness of the insulating resin layer of the electroconductive particle-filled sheet is preferably 1.0 or more times and 10 or less times, more preferably 1.2 or more times and 8 or less times, furthermore preferably 1.5 or more times and 6 or less times, still furthermore preferably 1.7 or more times and 5 or less times and yet furthermore preferably 2 or more times and 4 or less times the average particle diameter of the electroconductive particles. The thickness of the insulating resin layer set to fall within a range of 1.0 or more times and 10 or less times the average diameter of the electroconductive particles provides an insulating resin layer having a high thickness accuracy and facilitates attainment of low connection resistance.

Next, the electroconductive particle placement sheet of the present invention is obtained by stretching at a desired stretching ratio the stretchable sheet in which the electroconductive particle E has been fixed and the insulating resin layer 3 (or S) has been formed (FIG. 3($d$)). According to need, the stretchable sheet and the sticking agent are released from the electroconductive particle placement sheet.

In this case, the thickness of the insulating resin sheet is determined by the stretching ratio, the thickness of the insulating resin layer before stretching and the melt viscosity of the insulating resin layer at the time of stretching.

In this connection, examples of the stretchable sheet include sheets formed of: polyolefins such as polyethylene, polypropylene, polypropylene copolymer, polymethylpentene, polystyrene; polyesters such as polyethylene terephthalate (PET) and polyethylene naphthalate (PEN); and nylon, polyvinyl chloride and polyvinyl alcohol.

The stretching is a so-called biaxial stretching in which both of a longitudinal stretching and a transverse stretching are conducted, and can be conducted by heretofore known methods. Examples of such a stretching method include: a method in which stretching is conducted by nipping with devices such as clips two or four side edges of a film; and a method in which a film is inserted between two or more rolls and stretching is conducted by making the rotation speeds of these rolls different from each other. The stretching may be a simultaneous biaxial stretching in which a longitudinal stretching and a transverse stretching are conducted simultaneously, or a successive biaxial stretching in which stretching is conducted first in one direction and thereafter in the other direction. Preferable is a simultaneous biaxial stretching because the simultaneous biaxial stretching scarcely disturbs the array of the electroconductive particles. The stretching process determines the shape of the electroconductive particle placement sheet, and hence the temperature and the stretching rate at the time of stretching are important factors.

Stretching is conducted at a stretching temperature of preferably 70° C. or higher and 250° C. or lower, more preferably 75° C. or higher and 200° C. or lower, furthermore preferably 80° C. or higher and 160° C. or lower and still furthermore preferably 85° C. or higher and 145° C. or lower. When the stretching temperature is too high, the melt viscosity of the insulating resin sheet comes to be too low, and the coating of the top of the electroconductive particle with the insulating resin sheet cannot be made in a desired thickness. On the other hand, when the stretching temperature is low, the melt viscosity of the insulating resin sheet comes to be too high, and the electroconductive particles cannot stay in the insulating resin sheet, therefore, it is unpreferable. Stretching is conducted at a stretching rate of preferably 0.1%/sec or higher and 100%/sec or lower and more preferably 1%/sec or higher and 50%/sec or lower. The area magnification factor defined as the product of the longitudinal stretching magnification factor and the transverse stretching magnification factor is preferably 2.2 or more and 25 or less, more preferably 3 or more and 15 or less and furthermore preferably 3.5 or more and 10 or less.

The electroconductive particle placement sheet of the present invention may be used as it is as a bonding material by itself, or may be used in combination with an insulating film, and further, may be converted into an anisotropic electroconductive film in which an insulating adhesive layer 4 is laid on at least one side of the electroconductive particle placement sheet (FIGS. 3(e) and (f)). When converted into an anisotropic electroconductive film, the release of the stretchable sheet and the sticking agent may be conducted before or after laying the insulating adhesive. The release conducted after laying the insulating adhesive is preferable because of excellent workability.

The insulating adhesive used in the anisotropic electroconductive film of the present invention includes one or more resins selected from a thermosetting resin, a thermoplastic resin, a photocurable resin and an electron beam curing resin. Examples of such resins include: epoxy resin, phenolic resin, silicone resin, urethane resin, acrylic resin, polyimide resin, phenoxy resin, polyvinyl butyral resin, SBR, SBS, NBR, polyethersulfone resin, polyetherterephthalate resin, polyphenylene sulfide resin, polyamide resin, polyetheroxide resin, polyacetal resin, polystyrene resin, polyethylene resin, polyisobutylene resin, alkylphenolic resin, styrene-butadiene resin, carboxyl-modified nitrile resin, polyphenylene ether resin, polycarbonate resin, polyether ketone resin and the modified resins of these resins.

When the long-term reliability after connection is particularly required, the insulating adhesive preferably includes epoxy resin.

Examples of the epoxy resin used herein include: glycidyl ether epoxy resins such as bisphenol A epoxy resin, bisphenol F epoxy resin, bisphenol S epoxy resin, tetramethylbisphenol A epoxy resin, biphenol epoxy resin, naphthalene epoxy resin, fluorene epoxy resin, phenol novolac epoxy resin, cresol novolac epoxy resin, bisphenol A novolac epoxy resin and aliphatic ether epoxy resin; glycidyl ether ester epoxy resin; glycidyl ester epoxy resin; glycidyl amine epoxy resin; hydantoin epoxy resin; and alicyclic epoxide. These epoxy resins may have undergone halogenation or hydrogenation. Additionally, these epoxy resins may also be epoxy resins prepared by modification such as urethane modification, rubber modification or silicone modification.

When the insulating adhesive includes an epoxy resin, the insulating adhesive preferably includes a curing agent for epoxy resin. The curing agent for epoxy resin is preferably a latent curing agent from the viewpoint of storage stability. Preferable examples of such a latent curing agent include boron compounds, hydrazide, tertiary amines, imidazole, dicyandiamide, inorganic acids, carboxylic acid anhydrides, thiol, isocyanate and boron complexes, and derivatives thereof. Among the latent curing agents, microcapsule curing agents are preferable.

A microcapsule curing agent is prepared by stabilizing the surface of any of the above-described curing agents with resin coating or the like, and the resin coating thereof is broken due to the temperature or pressure applied at the time of connection operation to make the curing agent diffuse outside the microcapsule and the curing agent is allowed to react with epoxy resin. Among the microcapsule latent curing agents, latent curing agents prepared by microcapsulation of adduct curing agents such as amine adducts and imidazole adducts are excellent in the balance between stability and curability, and accordingly preferable. Each of these curing agents for epoxy resin is used generally in an amount of 2 to 100 parts by mass in relation to 100 parts by mass of the epoxy resin.

For the purpose of acquiring the properties such as film formability, adhesiveness and stress alleviation at the time of curing, the insulating adhesive used in the present invention preferably includes polymer components such as phenoxy resin, polyester resin, acryl rubber, SBR, NBR, silicone resin, polyvinyl butyral resin, polyurethane resin, polyacetal resin, urea resin, xylene resin, polyamide resin, polyimide resin, and rubbers and elastomers containing functional groups such as a carboxyl group, a hydroxyl group, a vinyl group and an amino group. These polymer components are preferably polymers each having a molecular weight of 10,000 to 1,000,000. The content of the polymer component is preferably 2 to 80% by mass in relation to the whole insulating adhesive.

Preferable as these polymer components is phenoxy resin from the viewpoint of long-term connection stability.

Examples of the phenoxy resin used herein include bisphenol A phenoxy resin, bisphenol F phenoxy resin, bisphenol A-bisphenol F mixed phenoxy resin, bisphenol A-bisphenol S mixed phenoxy resin, fluorene ring-containing phenoxy resin and caprolactone-modified bisphenol A phenoxy resin. The weight average molecular weight of the phenoxy resin is preferably 20,000 or more and 100,000 or less.

Preferable as the insulating adhesive used in the present invention are thermosetting epoxy resin adhesives containing an epoxy resin and a latent curing agent and being high in storage stability and in connection reliability. More preferable are epoxy resin adhesives containing a phenoxy resin. In such a case, the used amount of the phenoxy resin is preferably 50% by mass or less, more preferably 20% by mass or more and 46% by mass or less and furthermore preferably 30% by mass or more and 44% by mass or less in relation to the whole insulating adhesive.

The insulating adhesive may further contain, for example, an insulating particle, a filler, a flexibilizer, an accelerator, an antiaging agent, a colorant, a flame retarder, a thixotropic agent and a coupling agent. When an additive such as an insulating particle or a filler is contained, the maximum diameter of the additive is preferably smaller than the average particle diameter of the electroconductive particles. Additionally, the insulating adhesive may contain, for example, electroconductive particles for the purpose of preventing static charge within a content range not to disturb the insulation of the insulating adhesive.

As the coupling agent, from the viewpoint of improving adhesiveness, preferable are silane coupling agents each containing a ketimine group, a vinyl group, an acryl group, an amino group, an epoxy group or an isocyanate group.

When the individual components of the insulating adhesive are mixed together, a solvent may be used according to need. Examples of the solvent include methyl ethyl ketone, methyl isobutyl ketone, diethyl ketone, cyclohexanone, cyclopentanone, toluene, xylene, ethyl acetate, butyl acetate, ethylene glycol monoalkyl ether acetate, propylene glycol monoalkyl ether acetate, ethanol, isopropanol, dimethyl formamide and dimethyl acetamide.

The insulating adhesive can be prepared, for example, as follows: the individual components of the insulating adhesive are mixed together in a solvent to prepare a coating liquid, the coating liquid is applied to a substrate by coating such as applicator coating, and the solvent is evaporated in an oven to prepare the insulating adhesive.

The insulating adhesive has a function to seal the connection area at the time of connection in a flowing manner, and hence the insulating adhesive is preferably high in fluidity under the connection conditions. For the magnitude of the fluidity, important is the relative value thereof to the fluidity of the insulating resin sheet, and the melt viscosity at 180° C. of the insulating adhesive is preferably smaller than that of the insulating resin sheet, and is more preferably 50% or less, furthermore preferably 25% or less, and still furthermore preferably 15% or less, and yet furthermore preferably 10% or less of the viscosity of the insulating resin sheet.

The melt viscosity at 180° C. of the insulating adhesive falls within a range of preferably 1 Pa·s or more and 100 Pa·s or less, more preferably 2 Pa·s or more and 50 Pa·s or less and furthermore preferably 4 Pa·s or more and 30 Pa·s or less. When the melt viscosity is too high, a high pressure is required at the time of connection; on the other hand, when the melt viscosity is low, the storage at low temperatures is necessitated for the purpose of suppressing the deformation before use.

Herein, it is to be noted that when the insulating adhesive is a thermosetting resin, the melt viscosity of the insulating adhesive means the melt viscosity under the condition that the curing agent has been removed from the insulating adhesive, or no curing agent has been mixed in the insulating adhesive.

The insulating adhesive may be formed on only one side or on the both sides of the insulating resin sheet. When the temporary bonding performance of the anisotropic electroconductive film is desired to be improved, the insulating adhesives are preferably formed on the both sides.

When the insulating adhesives are laid on the both sides of the insulating resin sheet, the insulating adhesives on the respective sides may be the same or different from each other. When different from each other, the insulating adhesives may have the compositions respectively meeting the members to be connected; however, the need of preparing two different compositions arises.

The sum of the thickness values of the insulating adhesive is preferably 2 or more times and 100 or less times, more preferably 3 or more times and 75 or less times, furthermore preferably 4 or more times and 50 or less times and still furthermore preferably 5 or more times and 30 or less times the thickness of the electroconductive particle placement sheet.

The thickness of the anisotropic electroconductive film of the present invention is preferably 5 μm or more and 50 μm or less, more preferably 6 μm or more and 35 μm or less, furthermore preferably 7 μm or more and 25 μm or less and still furthermore preferably 8 μm or more and 22 μm or less.

Figure 4:
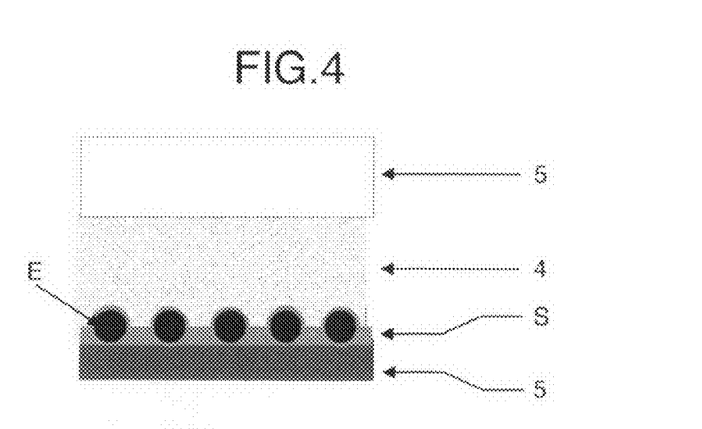
FIG. 4 is schematic cross sectional view of the anisotropic electroconductive film of the present invention.

The anisotropic electroconductive film of the present invention can suppress the attachment of foreign substances to the anisotropic electroconductive film by laying a release sheet 5 on one side or the both sides of the anisotropic electroconductive film (FIG. 4). Examples of the release sheet include films of polyethylene, polypropylene, polystyrene, polyester such as PET and PEN, nylon, polyvinyl chloride, and polyvinyl alcohol. Preferable examples of the resins for use in the release sheet include polypropylene and PET. The release sheet is preferably beforehand subjected to a surface treatment such as fluorine treatment, silicone treatment or alkyd treatment.

The anisotropic electroconductive film of the present invention is produced by, for example, a method in which the electroconductive particle placement sheet and a film-shaped insulating adhesive are laminated by using a hot roll, or a method in which the electroconductive particle placement sheet is coated with the insulating adhesive dissolved in a solvent and thereafter the solvent is evaporated.

In general, the anisotropic electroconductive film is slit to a desired width and wound in a reel form.

The thus produced anisotropic electroconductive film of the present invention can be suitably used for use in fine pitch connection, and can be suitably used for connection between a liquid crystal display and TCP, between TCP and FPC, between FPC and a printed wiring board, or in flip chip mounting for direct mounting of a semiconductor chip on a board.

The circuit connection method of the present invention is such that a circuit board such as a glass substrate on which circuits and electrodes are formed by wiring such as ITO wiring or metal wiring and an IC chip on which electrodes have been formed at the positions to make pairs with the electrodes on the circuit board are prepared, and the anisotropic electroconductive film of the present invention is bonded to the position, on the glass substrate, to which the IC chip is to be disposed. Next, the glass substrate and the IC chip are subjected to positioning so as for the electrodes of the glass substrate and the IC chip respectively to form pairs, and thereafter the glass substrate and the IC chip are bonded by thermal compression. The thermal compression is preferably conducted at temperatures falling within a range of 80° C. or higher and 250° C. or lower for 1 second or more and 30 minutes or less. The applied pressure is preferably 0.1 MPa or more and 50 MPa or less in relation to the surface of the IC chip.

EXAMPLES

The present invention is described in more detail with reference to Examples.

a. Melt Viscosity Measurement

Melt viscosity measurements were conducted with RHeoStress 600 Thermo, manufactured by HAAKE Co., by using a 20-mm diameter cone (PP20H).

Example 1

A varnish for the insulating resin sheet was obtained by mixing together 80 parts by mass of phenoxy resin (trade name: PKHC, manufactured by InChem. Co., Ltd.), 20 parts by mass of bisphenol A liquid epoxy resin (trade name: AER2603, manufactured by Asahi Kasei Chemicals Corp.), 0.25 part by mass of a silane coupling agent (trade name: A-187, manufactured by Japan Unicar Co., Ltd.) and 300 parts by mass of ethyl acetate. The melt viscosity at 180° C. of the insulating resin sheet obtained by removing the solvent from the varnish for the insulating resin sheet was found to be 1500 Pa·s.

An acrylic polymer diluted with ethyl acetate to a resin content of 5% by mass was applied onto a 100 μm unstretched copolymerized polypropylene film with a blade coater and dried at 80° C. for 10 minutes to form a 1 μm thick sticking agent layer. The acrylic polymer used herein is a polymer prepared by polymerizing, 62 parts by mass of methyl acrylate, 30.6 parts by mass of 2-ethylhexyl acrylate and 7 parts by mass of 2-hydroxyethyl acrylate, in 233 parts by mass of ethyl acetate, by using 0.2 part by mass of azobisisobutyronitrile as initiator, in a flow of nitrogen gas at 65° C. for 8 hours, the polymer thus obtained having a weight average molecular weight of $95 \times 10^4$. It is to be noted that the weight average molecular weight was measured by gel permeation chromatography (GPC) with polystyrene standards.

With electroconductive particles (trade name: Micropearl AU, manufactured by Sekisui Kagaku Kogyo Co., Ltd.) having an average particle diameter of 4 μm, the sticking agent was filled all over, and the electroconductive particles having not reached the sticking agent were removed with air blow at a pressure of 0.2 MPa. Consequently, a single-layered electroconductive particle layer having a filling factor of 74% was formed. Onto the single-layered electroconductive particle layer, the varnish for the insulating resin sheet was applied with a blade coater, dried at 80° C. for 10 minutes to form a 7 μm thick insulating resin sheet layer, and thus an electroconductive particle-filled sheet A was obtained.

Next, the electroconductive particle-filled sheet A was stretched with a test biaxial stretching machine at 135° C., at a rate of 10%/sec both longitudinally and transversely to a magnification of 2.2, and gradually cooled to room temperature. Then, the polypropylene film and the sticking agent were released from the electroconductive particle-embedded insulating resin sheet, and thus an electroconductive particle placement sheet A was obtained.

Figure 5:
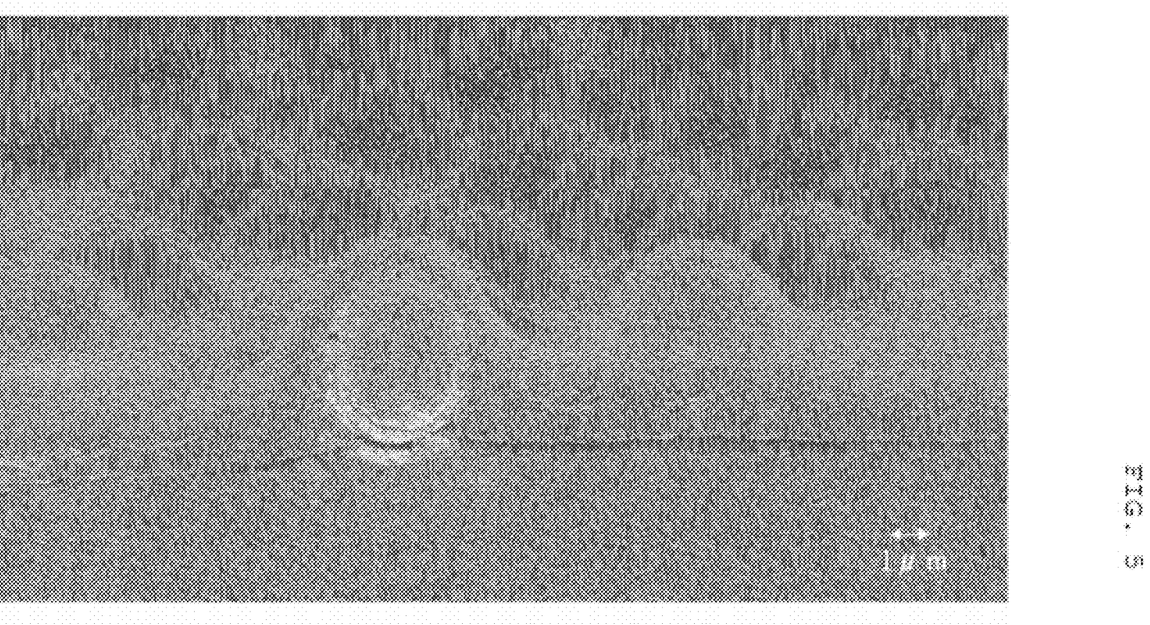
FIG. 5 is a SEM microgram of the electroconductive particle placement sheet of the present invention.

The electroconductive particle placement sheet A was observed with a scanning electron microscope (S-4700, manufactured by Hitachi, Ltd., hereinafter the same was used), and consequently it was found that the electroconductive particles were located in the insulating resin sheet, the electroconductive particle-free portions of the insulating resin sheet were approximately flat and smooth, the electroconductive particles protruded largely on one side of the insulating resin sheet, and the protruding portion of each of the electroconductive particles was covered with the insulating resin sheet. On the other hand, the opposite side had small protrusions, and in the protruding portions, the electroconductive particles were exposed. Additionally, the electroconductive particle placement sheet A was cut so as to pass through the center of the electroconductive particle, the cross section thus formed was observed with a scanning electron microscope (SEM) (FIG. 5), and consequently it was found that the thickness of the insulating resin sheet was 1.5 μm, and the top of the protruding portion on the side with the larger protrusion height of the electroconductive particle was covered with the insulating resin sheet having a thickness of 1.2 μm. On the other hand, the protrusion height of the electroconductive particle on the side with the smaller protrusion height was measured with a laser microscope (VK-9500, manufactured by Keyence Corp.) at intervals of 0.01 μm (hereinafter, the same was conducted), and was consequently found to be 0.1 μm. From the above-described results, the protrusion height of the electroconductive particle on the side with the larger protrusion height was derived to be 2.4 μm.

Further, from the image obtained by observing the electroconductive particle placement sheet A with a microscope (VHX-100, manufactured by Keyence Corp., hereinafter the same was used), by using an image processing software (trade name: A-zo Kun, manufactured by Asahi Kasei Corp., hereinafter the same was used), the average value of the intercentral distance between the electroconductive particles and the variation coefficient of the intercentral distance were derived and consequently found to be 10.1 μm and 0.29, respectively. The area proportion of the electroconductive particle was found to be 15.1%. It is to be noted that for the purpose of evaluating the intercentral distance between the electroconductive particles, the lengths of the sides of the triangles generated by the Delaunay triangulation, based on the centers of the particles, were used, and the observation of the electroconductive particles was conducted for the particles within an area of 0.06 mm$^2$.

For the purpose of evaluating the detachment behavior of the electroconductive particles from the electroconductive particle placement sheet A, the electroconductive particle placement sheet was subjected to rubbing at a pressure of 1 kPa with Kimwipe 100 times per one side, thereafter the detachment of the particles was observed with a microscope, and consequently, absolutely no detachment of the particles was identified.

A varnish was obtained by mixing together 100 parts by mass of phenoxy resin (trade name: PKHC, manufactured by InChem. Co., Ltd.), 90 parts by mass of bisphenol A liquid epoxy resin (trade name: AER2603, manufactured by Asahi Kasei Chemicals Corp.), 60 parts by mass of a mixture (trade name: Novacure, manufactured by Asahi Chemicals Corp.) composed of a microcapsulated latent curing agent and a liquid epoxy resin (liquid epoxy resin content: 40 parts by mass), 0.25 part by mass of a silane coupling agent (trade name: A-187, manufactured by Japan Unicar Co., Ltd.) and 300 parts by mass of ethyl acetate. The varnish was applied onto a release sheet made of a 50 μm mold release-treated PET film with a blade coater, and the solvent was removed by drying, and thus a film-shaped insulating adhesive B having a thickness of 17 μm was obtained. Separately, an insulating adhesive was prepared in the same manner as above, provided that 40 parts by mass of the liquid epoxy resin was formulated in place of 60 parts by mass of the mixture composed of the microcapsulated latent curing agent and the liquid epoxy resin, and the melt viscosity of the thus obtained insulating adhesive was measured; consequently, the melt viscosity at 180° C. of the insulating adhesive B was found to be 10.5 Pa·s.

An insulating adhesive C different only in thickness from the insulating adhesive B was obtained in the same manner as in the case of the insulating adhesive B. The thickness of the insulating adhesive was found to be 2 μm.

The insulating adhesive B was laminated on the side, with the larger protrusion height of the electroconductive particle, of the electroconductive particle placement sheet A obtained in Example 1, and the insulating adhesive C was laminated on the side, with the smaller protrusion height, of the sheet A, and then lamination was conducted under the conditions of 55° C. and 0.3 MPa to yield an anisotropic electroconductive film A.

Next, a 1.6 mm×15 mm bare chip in which 20 μm×100 μm gold bumps were arrayed with a pitch of 30 μm and an ITO (Indium Tin Oxide) glass substrate having a connection pitch corresponding to the bare chip were prepared; at the chip mounting position of the glass substrate, the anisotropic electroconductive film A in which the release sheet on the insulating adhesive C side had been removed was placed and hot pressed under the conditions of 70° C., 5 kg/cm$^2$ and a period of 2 seconds; the release sheet on the insulating adhesive B side was released, and thereafter by using a flip chip bonder (FC 2000, manufactured by Toray Engineering Co., Ltd., hereinafter the same was used), the bare chip was subjected to positioning, and heated and pressed at 30 kg/cm$^2$ for 10 seconds under the conditions that heating was made with a constant heat to 190° C. in 2 seconds and thereafter the temperature was maintained constant, and thus the bare chip was connected to the ITO glass substrate.

At this time, the insulating adhesive flowed and was found to flow outside the bare chip. After completion of connection, the number of the electroconductive particles interposed between the gold bumps and the ITO electrodes, namely, the number of the electroconductive particles effectively operating for connection was counted in an area of 40 bumps, and consequently, the average number was found to be 14.4, the standard deviation was found to be 1.9, the minimum number of particles in all connections defined by the average−3× the standard deviation was found to be 8.7, and thus a stable connection was found to be possible. Additionally, the conduction resistance measurement based on 64 pairs of daisy chain circuits formed of the bare chip and the ITO glass electrodes, and the insulation resistance measurement based on 40 pairs of comb-shaped electrodes formed of the bare chip and the ITO glass electrodes were conducted. Consequently the conduction resistance inclusive of the wiring resistance was found to be 2.9 kΩ, revealing that all of the 64 pairs of electrodes were connected; on the other hand, the insulation resistance was found to be 10$^9$Ω or more, and hence no short circuiting was caused between any pair of the 40 pairs of comb-shaped electrodes, and the usefulness in the fine pitch connection was verified.

Example 2

An electroconductive particle-filled sheet was obtained in the same manner as in Example 1 except that the phenoxy resin (trade name: PKHB, manufactured by InChem. Co., Ltd., melt viscosity at 180° C.: 980 Pa·s) was used alone as the insulating resin sheet, the average particle diameter of the electroconductive particles was changed to 3 m and the filling factor was changed to 82%. An electroconductive particle placement sheet (referred to as the electroconductive particle placement sheet B) was obtained in the same manner as in Example 1 except that the stretching magnification factor was altered to 2.7.

The obtained electroconductive particle placement sheet B was observed with the scanning electron microscope, and consequently it was found that the electroconductive particles were located in the insulating resin sheet, the electroconductive particle-free portions of the insulating resin sheet were approximately flat and smooth, the electroconductive particles protruded largely on one side of the insulating resin sheet, and the protruding portion of each of the electroconductive particles was covered with the insulating resin sheet. On the other hand, the opposite side had small protrusions, and in the protruding portions, the electroconductive particles were exposed. Additionally, the electroconductive particle placement sheet B was cut so as to pass through the center of the electroconductive particle, the cross section thus formed was observed with the scanning electron microscope, and consequently it was found that the thickness of the insulating resin sheet was 0.8 μm, and the top of the protruding portion on the side with the larger protrusion height of the electroconductive particle was covered with the insulating resin sheet having a thickness of 0.3 μm. On the other hand, the protrusion height of the electroconductive particle on the side with the smaller protrusion height was measured with the laser microscope and was consequently found to be 0.1 μm. From the above-described results, the protrusion height of the electroconductive particle on the side with the larger protrusion height was derived to be 2.1 μm.

Further, from the image obtained by observing the electroconductive particle placement sheet B with the microscope, by using the image processing software, the average value of the intercentral distance between the electroconductive particles and the variation coefficient of the intercentral distance were derived and consequently found to be 9.1 μm and 0.19, respectively. The area proportion of the electroconductive particle was found to be 11%.

For the purpose of evaluating the detachment behavior of the electroconductive particles from the electroconductive particle placement sheet B, the electroconductive particle placement sheet was subjected to rubbing at a pressure of 1 kPa with Kimwipe 100 times per one side, thereafter the detachment of the particles was observed with a microscope, and consequently, absolutely no detachment of the particles was identified.

Next, in the same manner as in Example 1, the insulating adhesive B was laminated on the side with the larger protrusion height of the electroconductive particle, and thus the anisotropic electroconductive film B was obtained. Also, in the same manner as in Example 1, the connection between the bare chip and the ITO glass substrate was conducted in such a way that the electroconductive particle placement sheet faced the ITO glass substrate.

After completion of connection, the number of the electroconductive particles interposed between the gold bumps and the ITO electrodes was counted in an area of 40 bumps, and consequently, the average number was found to be 16.4, the standard deviation was found to be 1.3, the minimum number of particles in all connections defined by the average−3× the standard deviation was found to be 12.5, and thus a stable connection was found to be possible. Additionally, the conduction resistance measurement based on 64 pairs of daisy chain circuits formed of the bare chip and the ITO glass electrodes, and the insulation resistance measurement based on 40 pairs of comb-shaped electrodes formed of the bare chip and the ITO glass electrodes were conducted. Consequently the conduction resistance inclusive of the wiring resistance was found to be 3.1 kΩ, revealing that all of the 64 pairs of electrodes were connected; on the other hand, the insulation resistance was found to be $10^9 \Omega$ or more, and hence no short circuiting was caused between any pair of the 40 pairs of comb-shaped electrodes, and the usefulness in the fine pitch connection was verified.

Comparative Example 1

An electroconductive particle placement sheet (referred to as the electroconductive particle placement sheet C) was obtained in the same manner as in Example 1 except that the coating amount of the varnish for the insulating resin sheet was decreased and the thickness of the insulating resin sheet layer was set at 3.5 μm.

The obtained electroconductive particle placement sheet C was observed with the scanning electron microscope, and consequently it was found that the electroconductive particles were incorporated, in a penetrating manner, in the approximately flat and smooth insulating resin sheet in such a way that the electroconductive particles protruded largely on one side of the insulating resin sheet and such electroconductive particles were exposed on the both sides of the insulating resin sheet. Additionally, the electroconductive particle placement sheet C was cut so as to pass through the center of the electroconductive particle, the cross section thus formed was observed with the scanning electron microscope, and consequently it was found that the thickness of the insulating resin sheet was 0.8 μm, and the top of the protruding portion on the side with the larger protrusion height of the electroconductive particle was exposed. The protrusion heights were measured with the laser microscope and were consequently found to be 3.1 μm and 0.1 μm.

For the purpose of evaluating the detachment behavior of the electroconductive particles from the electroconductive particle placement sheet C, the electroconductive particle placement sheet was subjected to rubbing at a pressure of 1 kPa with Kimwipe 100 times per one side, thereafter the detachment of the particles was observed with a microscope, and consequently, detachment of approximately 20% of the particles was found, and accordingly the electroconductive particle placement sheet C was found to be unusable as a connection material.

Comparative Example 2

An electroconductive particle placement sheet (referred to as the electroconductive particle placement sheet D) was obtained in the same manner as in Example 1 except that the coating amount of the varnish for the insulating resin sheet was increased and the thickness of the insulating resin sheet layer was set at 20 μm.

The obtained electroconductive particle placement sheet D was observed with the scanning electron microscope, and consequently it was found that no protrusion of the electroconductive particles occurred and the electroconductive particles were embedded in the approximately flat and smooth insulating resin sheet having a thickness of 4.5 μm.

Next, in the same manner as in Example 1, the insulating adhesive B was laminated on one side, and thus an anisotropic electroconductive film D was obtained. In the same manner as in Example 2, the connection between the bare chip and the ITO glass substrate was conducted in such a way that the electroconductive particle placement sheet faced the ITO glass substrate.

The conduction resistance measurement based on 64 pairs of daisy chain circuits formed of the bare chip and the ITO glass electrodes was conducted, and consequently it was found that no electric current flowed in the daisy chain, no electrical connection was made, and accordingly the electroconductive particle placement sheet D was found to be unusable as a connection material.

INDUSTRIAL APPLICABILITY

The electroconductive particle placement sheet of the present invention is low in the occurrence probability of detachment of electroconductive particles in the course from the production to the use thereof, excellent in connection reliability of microelectrodes and high in insulation between adjacent electrodes with narrow spaces therebetween in the electrical connection in micropattern wiring, and can be preferably used in an application as a connection material capable of making low-resistance connection.

The invention claimed is:

1. An anisotropic electroconductive film comprising: an electroconductive particle placement sheet comprising electroconductive particles and an insulating resin sheet having a reference plane P1 and a reference plane P2 opposite thereto; and an insulating adhesive layer laid on at least one side of the electroconductive particle placement sheet;

wherein a thickness of the insulating resin sheet of the electroconductive particle placement sheet is smaller than an average particle diameter of the electroconductive particles, the electroconductive particles protrude from at least the reference plane P1 on one side of the insulating resin sheet, and the portion of the electroconductive particles protruding from the reference plane P1 of the insulating resin sheet is covered with a coating layer formed of the same resin as the insulating resin that forms the insulating resin sheet;

a relation $h1>h2$ is satisfied wherein an average of a distance between the reference plane P1 and a tangential line L1 of the electroconductive particles which is parallel to the reference plane P1 and tangential to the portion of the electroconductive particles, protruding from the reference plane P1 is defined as an average protrusion height h1 ($h1>0$), and an average of a distance between the reference plane P2 and a tangential line L2 of the electroconductive particles which is parallel to the reference plane P2 and is located on the opposite side of the electroconductive particles from the tangential line L1 is defined as an average protrusion height h2 (provided that $h2<0$ if the tangential line L2 is located within the insulating resin sheet, $h2=0$ if the tangential line L2 is located on the reference plane P2, and $h2>0$ if the tangential line L2 is located outside the insulating resin sheet); and a melt viscosity of the insulating resin sheet at 180° C. is 10 Pa·s or more and $5\times10^4$ Pa·s or less.

2. The anisotropic electroconductive film according to claim 1, wherein the electroconductive particles protrude from both sides of the insulating resin sheet, and a ratio, h2/h1, of the average protrusion height h2 to the average protrusion height h1 is 0 or more and 1/1.1 or less.

3. The anisotropic electroconductive film according to claim 2, wherein a portion of the electroconductive particles protrude from the reference plane P2 and is exposed from the insulating resin sheet.

4. The anisotropic electroconductive film according to claim 1, wherein a coating thickness of a top portion of the coating layer of the electroconductive particles protruding from the reference plane P1 is 0.1 μm or more and 2 μm or less.

5. The anisotropic electroconductive film according to claim 1, wherein an area proportion of the electroconductive particles defined as a proportion of a sum of projected areas of the electroconductive particles in relation to an area of the insulating resin sheet is 2% or more and 40% or less.

6. The anisotropic electroconductive film according to claim 1, wherein the insulating resin sheet comprises a phenoxy resin.

7. The anisotropic electroconductive film according to claim 1, wherein the average particle diameter of the electroconductive particles is 0.5 μm or more and 10 μm or less.

8. The anisotropic electroconductive film according to claim 1, wherein a variation coefficient of an intercentral distance between the electroconductive particles is 0.03 or more and 0.6 or less.

9. A method for producing an anisotropic electroconductive film according to claim 1, comprising:

producing an electroconductive particle placement sheet by;

forming an electroconductive particle layer by filling a stretchable sheet with electroconductive particles in a manner providing a single layer;

forming an insulating resin layer on the electroconductive particle layer so as to form an electroconductive particle-filled sheet; and stretching the electroconductive particle-filled sheet; and laying an insulating adhesive layer on at least one side of the stretched electroconductive particle-filled sheet.

10. The method according to claim 9, wherein when the electroconductive particle layer is formed by filling the stretchable sheet with the electroconductive particles in a manner providing a single layer, a sticking agent is applied to the stretchable sheet, and then the electroconductive particle layer is formed by filling the sticking agent with the electroconductive particles in a manner providing a single layer.

11. The method according to claim 9, wherein a thickness of the insulating resin layer in the electroconductive particle-filled sheet is 1.0 or more times and 10 or less times the average particle diameter of the electroconductive particles.

12. The method according to claim 10, wherein when the sticking agent is applied to the stretchable sheet followed by forming the electroconductive particle layer by filling the sticking agent with the electroconductive particles in a manner providing a single layer, the electroconductive particles are embedded in the sticking agent.

13. The method according to claim 9, wherein when the electroconductive particle layer is formed by filling the stretchable sheet with the electroconductive particles in a manner providing a single layer, the stretchable sheet is filled with the electroconductive particles in such a way that a filling factor defined as a ratio of the projected areas of the electroconductive particles to a total area is 50% or more and 90% or less.

14. The method according to claim 9, wherein when the insulating resin layer is formed on the electroconductive particle layer, a sheet-shaped insulating resin is formed as the insulating resin layer on the electroconductive particle layer.

15. The method according to claim 9, wherein when the insulating resin layer is formed on the electroconductive particle layer, an insulating resin obtained by applying the insulating resin dissolved in a solvent and by drying the solvent is formed as the insulating resin layer on the electroconductive particle layer.

16. The method according to claim 9, wherein the step of stretching is a biaxial stretching having an area magnification factor defined as a product of a longitudinal stretching magnification factor and a transverse stretching magnification factor is 2.2 or more and 25 or less.

17. A circuit connection method electrically connecting electrodes of an IC chip to electrodes of a circuit board, comprising applying pressure under the conditions that the anisotropic electroconductive film according to any one of claims 1 to 8 or produced by the method according to any one of claims 9 to 16 is held between the circuit board and the IC chip.

18. A connected structure obtained by the method according to claim 17.

* * * * *